(12) United States Patent
Chen et al.

(10) Patent No.: US 11,362,029 B2
(45) Date of Patent: Jun. 14, 2022

(54) INTEGRATED CIRCUIT STRUCTURE OF CAPACITIVE DEVICE

(71) Applicant: TAIWAN SEMICONDUCTOR MANUFACTURING COMPANY LTD., Hsinchu (TW)

(72) Inventors: Tai-Yi Chen, Hsinchu (TW); Yung-Chow Peng, Hsinchu (TW); Chung-Chieh Yang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/115,351

(22) Filed: Dec. 8, 2020

(65) Prior Publication Data

US 2021/0090989 A1    Mar. 25, 2021

Related U.S. Application Data

(62) Division of application No. 16/442,400, filed on Jun. 14, 2019, now Pat. No. 10,867,904.

(51) Int. Cl.
| | |
|---|---|
| *H01L 23/522* | (2006.01) |
| *H03M 1/38* | (2006.01) |
| *H01L 23/552* | (2006.01) |
| *H01L 49/02* | (2006.01) |

(52) U.S. Cl.
CPC ...... *H01L 23/5225* (2013.01); *H01L 23/5223* (2013.01); *H01L 23/5226* (2013.01); *H01L 23/552* (2013.01); *H01L 28/40* (2013.01); *H01L 28/60* (2013.01); *H01L 28/86* (2013.01); *H01L 28/92* (2013.01); *H03M 1/38* (2013.01)

(58) Field of Classification Search
CPC ..... H01L 23/5225; H01L 28/40; H01L 28/60; H01L 28/92; H01L 28/86; H01L 23/5223; H01L 23/5226; H01L 23/552; H03M 1/38; H03M 1/466
See application file for complete search history.

(56) References Cited

U.S. PATENT DOCUMENTS

| | | | |
|---|---|---|---|
| 9,331,026 B1 * | 5/2016 | Watt | H01L 23/5225 |
| 2009/0160019 A1 * | 6/2009 | Yang | H01L 23/5223 257/532 |
| 2009/0224359 A1 * | 9/2009 | Chang | H01L 23/5223 257/522 |
| 2009/0296313 A1 | 12/2009 | Chiu | |

(Continued)

*Primary Examiner* — Ahmed N Sefer
(74) *Attorney, Agent, or Firm* — WPAT, P.C., Intellectual Property Attorneys; Anthony King

(57) ABSTRACT

An integrated circuit structure includes a first conductive plate, a second conductive plate, a plurality of conductive lines, and a plurality of conductive vias. The first conductive plate is disposed in a first layer on a semiconductor substrate. The second conductive plate is disposed in a second layer on the semiconductor substrate. The plurality of conductive lines are disposed in the first layer for surrounding the first conductive plate. The plurality of conductive vias are arranged to couple the plurality of conductive lines to the second conductive plate. The second layer is different from the first layer, and the first conductive plate is physically separated from the second conductive plate, the plurality of conductive lines, and the plurality of conductive vias.

20 Claims, 10 Drawing Sheets

(56) References Cited

U.S. PATENT DOCUMENTS

| | | | |
|---|---|---|---|
| 2010/0061035 A1* | 3/2010 | Kitamura | H01L 23/5223 361/301.4 |
| 2010/0232085 A1* | 9/2010 | Wang | H01L 23/5223 361/303 |
| 2012/0104387 A1* | 5/2012 | Chen | H01L 22/34 257/48 |
| 2012/0286393 A1 | 11/2012 | Lin | |
| 2014/0049872 A1* | 2/2014 | Huang | H01L 23/5223 361/301.4 |
| 2014/0145304 A1 | 5/2014 | Lin | |
| 2014/0252546 A1* | 9/2014 | Yen | H01L 23/5223 257/532 |
| 2014/0264742 A1 | 9/2014 | Yen | |
| 2015/0048482 A1 | 2/2015 | Shih | |
| 2015/0130023 A1 | 5/2015 | Yen | |
| 2018/0366822 A1* | 12/2018 | Cheng | H01L 23/642 |
| 2019/0164903 A1* | 5/2019 | Chen | H01L 28/90 |
| 2019/0244894 A1 | 8/2019 | Fu | |
| 2020/0044012 A1 | 2/2020 | Chen | |

\* cited by examiner

INTEGRATED CIRCUIT STRUCTURE OF CAPACITIVE DEVICE

CROSS REFERENCE TO RELATED APPLICATIONS

This application is a divisional of U.S. application Ser. No. 16/442,400, filed on Jun. 14, 2019, which application is hereby incorporated herein by reference.

BACKGROUND

Capacitors are widely used in integrated circuits. One of the most commonly used capacitors is the metal-oxide-metal (MOM) capacitor. In the field of Internet of Things (IOT), a high resolution applications, such as a Successive Approximation Register Analog-to-Digital Converter (SAR-ADC), require a plurality of switched capacitors with low power consumption and low mismatch. However, the conventional MOM may easily be affected by electromagnetic (EM) aggression from surroundings which leads unexpected mean shift of MOM. In addition, the mismatch problem of the MOM array may degrade integral nonlinearity/differential nonlinearity (INL/DNL) performance of the SAR-ADC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
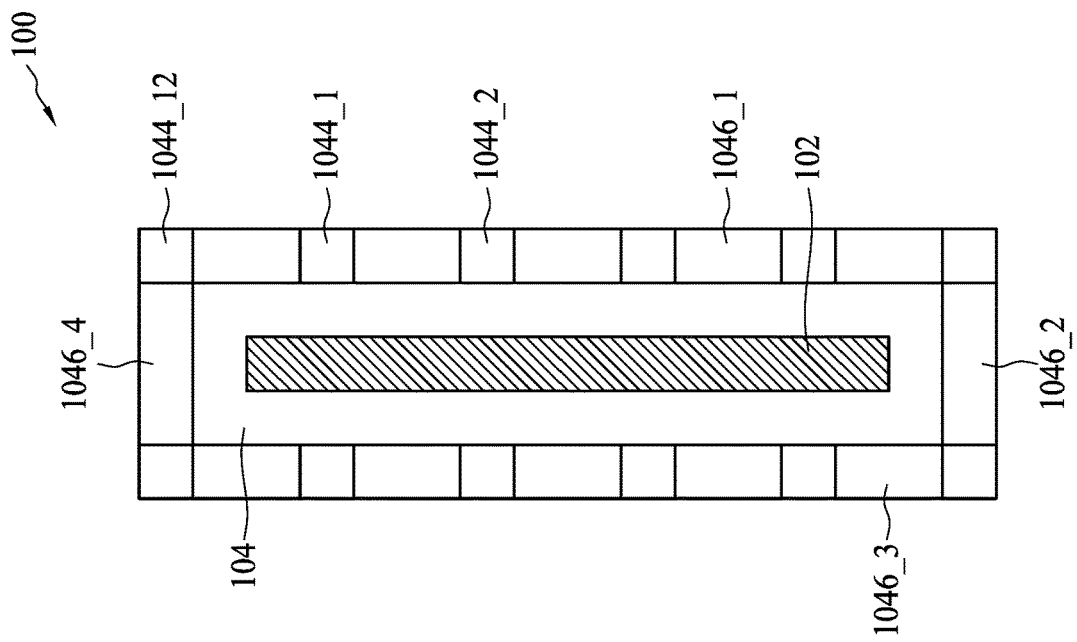
FIG. 1B is a diagram illustrating a top view of the capacitive device of FIG. 1A in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
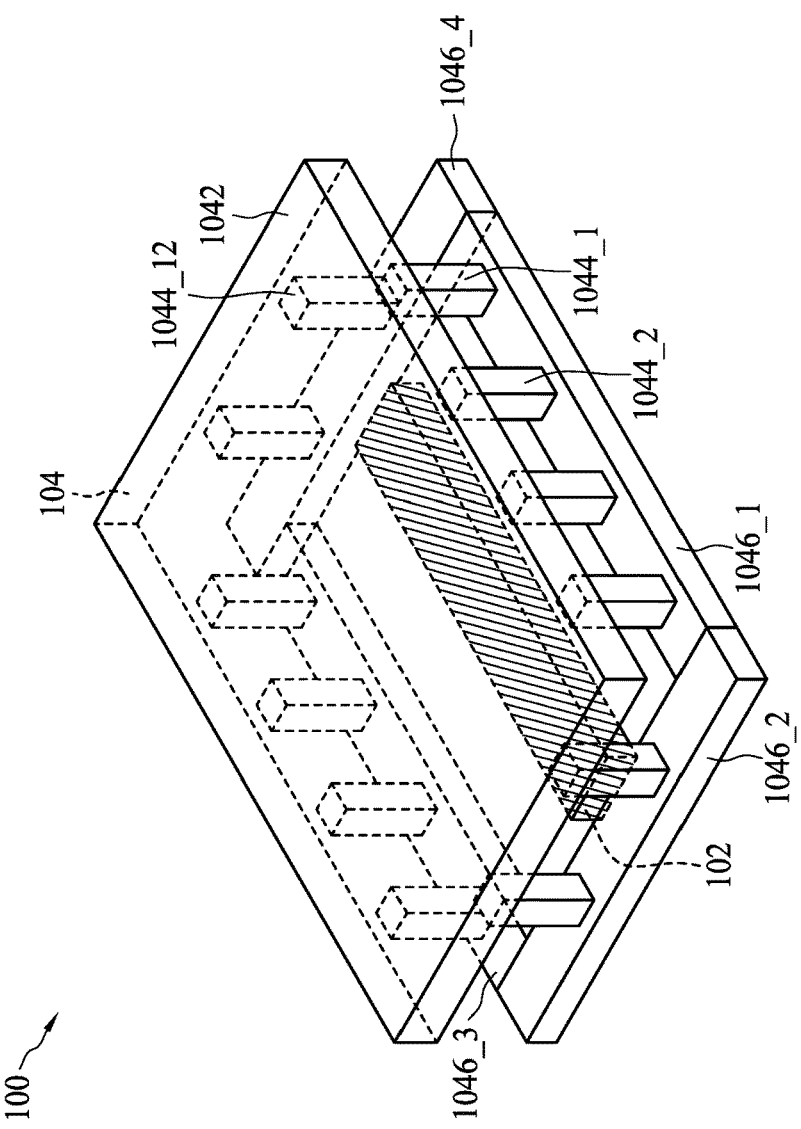
FIG. 1A is a diagram illustrating a capacitive device in accordance with some embodiments.

FIG. 1A is a diagram illustrating a capacitive device 100 in accordance with some embodiments. FIG. 1B is a diagram illustrating a top view of the capacitive device 100 in accordance with some embodiments. The capacitive device 100 may be a Metal-Oxide-Metal (MOM) capacitor. Specifically, the capacitive device 100 is a top-closed MOM capacitor. The capacitive device 100 comprises a first electrode 102 and a second electrode 104. The capacitive device 100 as shown in FIG. A is a cell level capacitor.

According to some embodiments, the first electrode 102 is configured to be a metal line on a metal layer, e.g. the fourth metal layer M4, above a semiconductor substrate. The second electrode 104 is configured to be a cover-shaped device covering the top of the first electrode 102. The second electrode 104 comprises a metal plate 1042, a plurality of conductive vias, which is simplified as "via" in the following paragraphs, 1044_1-1044_12, and a plurality of metal lines 1046_1-1046_4. It is noted that the metal mentioned above is merely an example, the metal may be replaced with any conductive materials, e.g. Polycrystalline silicon. The numbers of the vias 1044_1-1044_12 and the metal lines 1046_1-1046_4 may also be replaced with other numbers depended on the requirement. The first electrode 102 and the second electrode 104 are physically separated by an oxide layer (not shown in FIG. 1A) formed between them. Specifically, the first electrode 102 is physically separated from the second electrode 104, the metal lines 1046_1-1046_4, and the vias 1044_1-1044_12 by an oxide layer (not shown in FIG. 1A) formed among them.

According to some embodiments, the metal lines 1046_1-1046_4 are formed on the same metal layer with the first electrode 102, e.g. the fourth metal layer M4, above the semiconductor substrate (not shown). The metal lines 1046_1-1046_4 are configured to be a closed loop surrounding the first electrode 102. However, this is not a limitation of the present embodiment. The second electrode 104 may be an opened loop structure, e.g. a U-shaped structure. The metal plate 1042 is formed on the metal layer above the fourth metal layer M4, e.g. the fifth metal layer M5, on the semiconductor substrate. The vias 1044_1044_12 are arranged to connect the metal lines 1046_1-1046_4 to the periphery of the metal plate 1042 respectively. It is noted that the fourth metal layer M4 is closer to the semiconductor substrate than the fifth metal layer M5.

It is noted that, in another embodiment, the first electrode 102 may be formed on different metal layer from the metal lines 1046_1-1046_4. For example, the first electrode 102 may be formed on the third metal layer M3, and the metal lines 1046_1-1046_4 and the metal plate 1042 may be formed on the fourth metal layer M4 and the fifth metal layer M5 respectively.

Figure 2B:
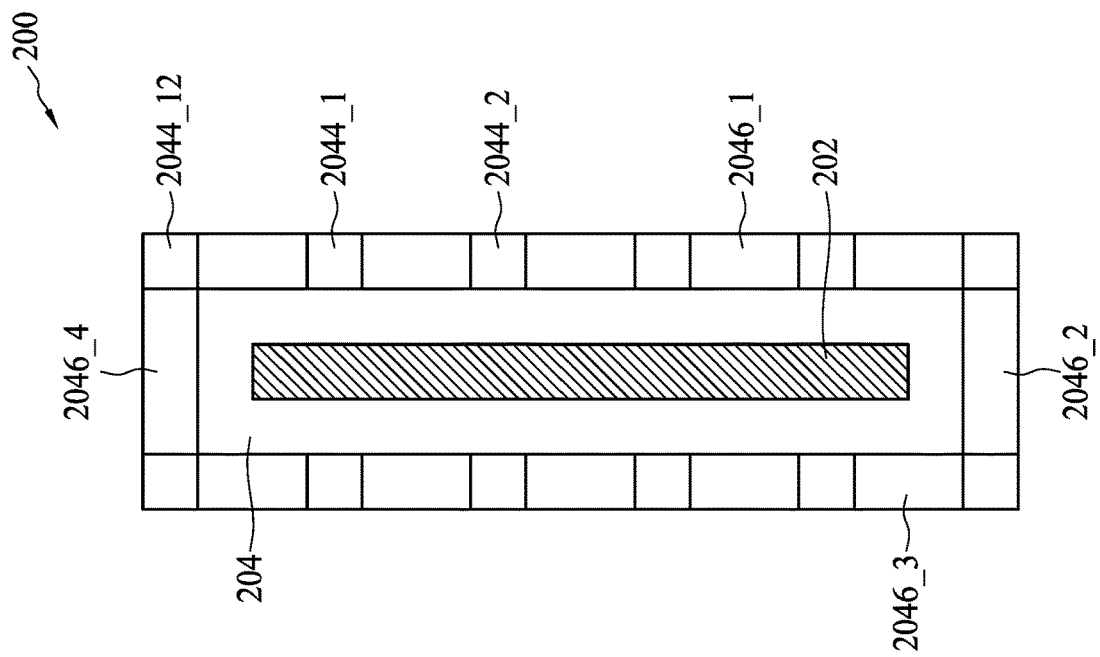
FIG. 2B is a diagram illustrating a top view of the capacitive device of FIG. 2A in accordance with some embodiments.
Figure 2A:
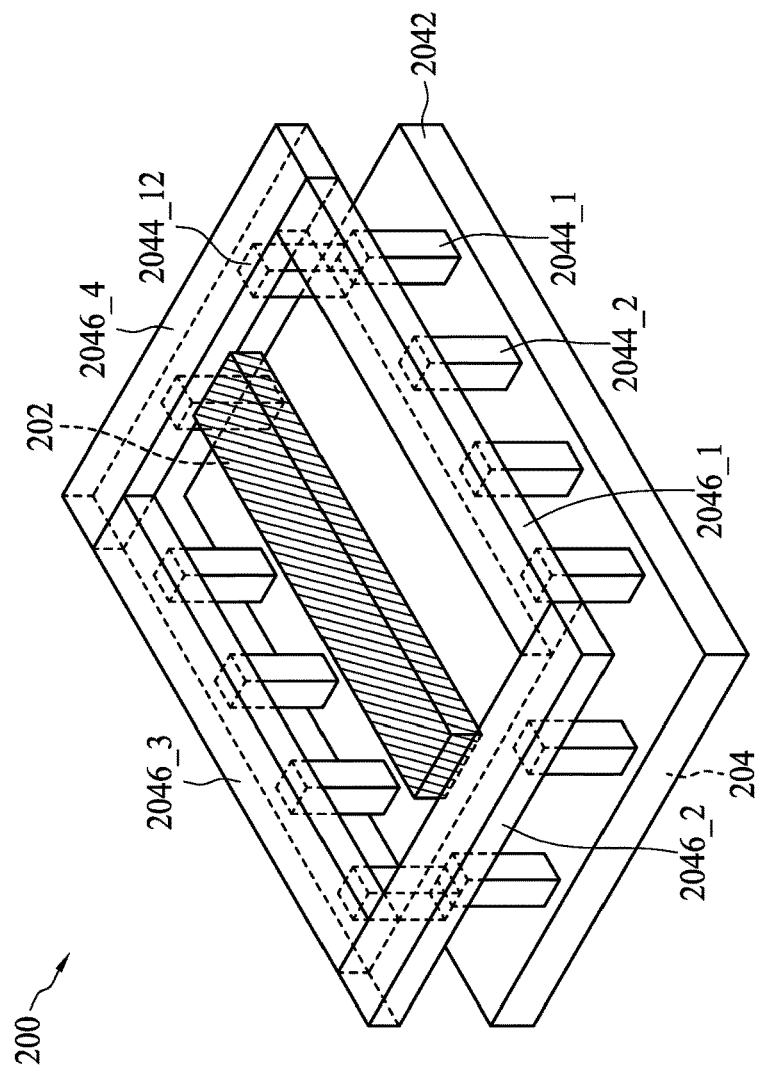
FIG. 2A is a diagram illustrating a capacitive device in accordance with some embodiments.

FIG. 2A is a diagram illustrating a capacitive device 200 in accordance with some embodiments. FIG. 2B is a diagram illustrating a top view of the capacitive device 200 in accordance with some embodiments. The capacitive device 200 is a bottom-closed MOM capacitor. The capacitive device 200 comprises a first electrode 202 and a second electrode 204. The first electrode 202 and the second electrode 204 are physically separated by an oxide layer (not shown in FIG. 2A) formed between them. The capacitive device 200 as shown in FIG. 2A is a cell level capacitor.

According to some embodiments, the first electrode 202 is configured to be a metal line on a metal layer, e.g. the fifth metal layer M5, above a semiconductor substrate. The second electrode 204 is configured to be a cover-shaped device covering the bottom of the first electrode 202. The second electrode 204 comprises a metal plate 2042, a plurality of vias 2044_1-2044_12, and a plurality of metal lines 2046_1-2046_4. It is noted that the metal mentioned above is merely an example, the metal may be replaced with any conductive materials, e.g. Polycrystalline silicon. The numbers of the vias 2044_1-2044_12 and the metal lines 2046_1-2046_4 may also be replaced with other numbers depended on the requirement.

According to some embodiments, the metal lines 2046_1-2046_4 are formed on the same metal layer with the first electrode 202, e.g. the fifth metal layer M5. The metal lines 2046_1-2046_4 are configured to be a closed loop. However, this is not a limitation of the present embodiment. The second electrode 204 may be an opened loop structure, e.g. a U-shaped structure. The metal plate 2042 is formed on the metal layer below the fifth metal layer M5, e.g. the fourth metal layer M4. The vias 2044_2044_12 are arranged to connect the metal lines 2046_1-2046_4 to the periphery of the metal plate 2042 respectively.

It is noted that, in another embodiment, the first electrode 202 may be formed on different metal layer from the metal lines 2046_1-2046_4. For example, the first electrode 202 may be formed on the sixth metal layer M6 above the semiconductor substrate (not shown), and the metal lines 2046_1-2046_4 and the metal plate 2042 may be formed on the fifth metal layer M5 and the fourth metal layer M4 above the semiconductor substrate respectively. It is noted that the fourth metal layer M4 is closer to the semiconductor substrate than the fifth metal layer M5, and the fifth metal layer M5 is closer to the semiconductor substrate than the sixth metal layer M6.

The capacitive device 100 as well as 200 may be used in high resolution applications that require high matching performance. For example, the capacitive device 100 may be applied in the switched capacitors of a 10 bits SAR-ADC (Successive Approximation Register Analog-to-Digital Converter). When the capacitive device 100 is applied in the switched capacitors, the first electrode 102 (as well as 202) is connected to the signal node and the second electrode 104 (as well as 204) is connected to the common node.

According to the embodiments, when the second electrode 104 covers the top of the fist electrode 102, the electric field of the capacitive device 100 may be confined in the overlapped area between the first electrode 102 and the second electrode 104. When the electric field is confined between the first electrode 102 and the second electrode 104, the electromagnetic (EM) may not radiate to or extend the area outside the overlapped area. Therefore, the fringing effect of the capacitive device 100 is improved. When the fringing effect of the capacitive device 100 is improved, the mismatch problem or spatial effect is also improved when a plurality of capacitive devices 100 as well as 200 are applied in the switched capacitors of a high resolution SAR-ADC.

Figure 3:
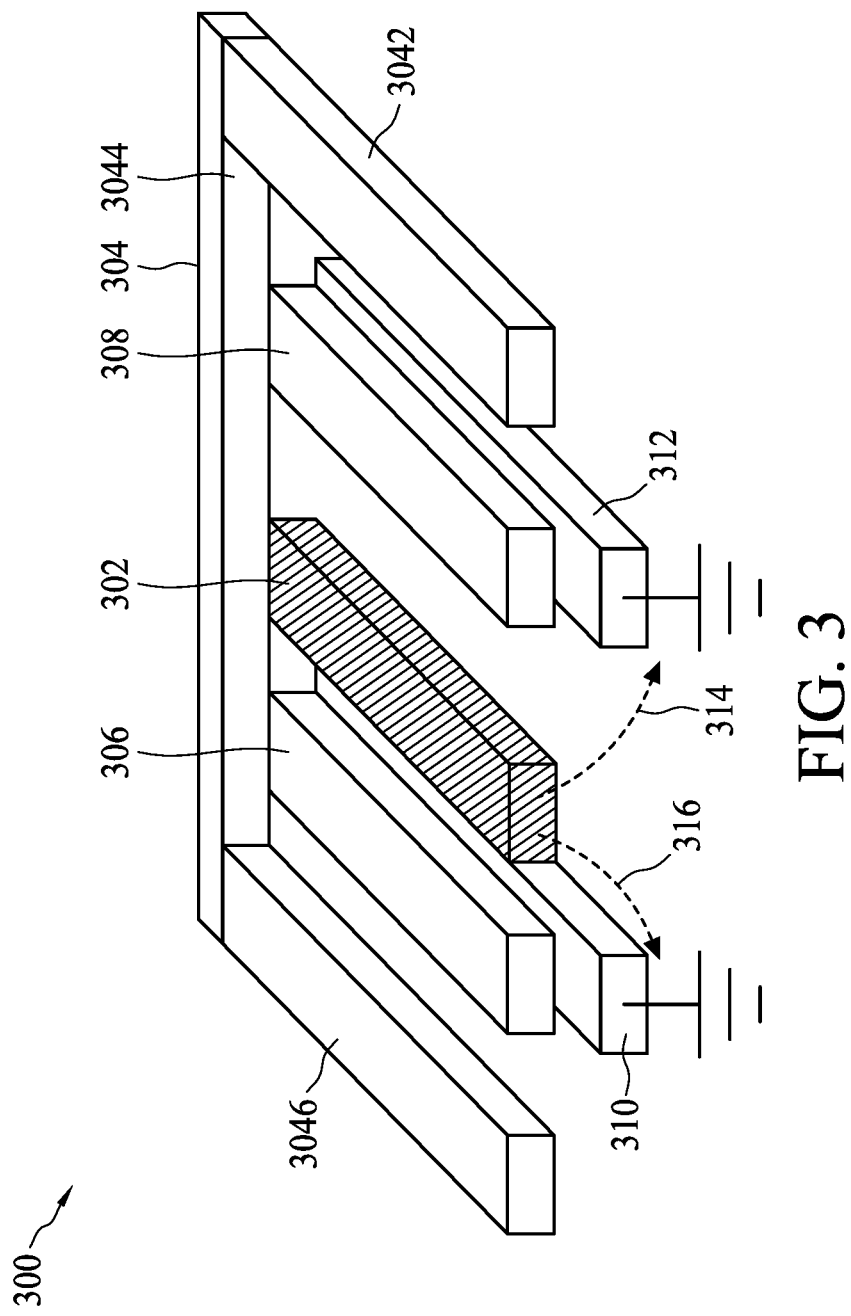
FIG. 3 is a diagram illustrating a capacitive device in accordance with some embodiments.

FIG. 3 is a diagram illustrating a capacitive device 300 in accordance with some embodiments. The capacitive device 300 may be a MOM capacitor. Specifically, the capacitive device 300 is a finger MOM capacitor. The capacitive device 300 comprises a first electrode 302, a second electrode 304, a plurality of dummy metal lines 306 and 308, and a plurality of shielding metal lines 310 and 312. The capacitive device 300 as shown in FIG. 3 is a cell level capacitor. The first electrode 302 and the second electrode 304 are physically separated by an oxide layer (not shown in FIG. 1A) formed between them. The dummy metal lines 306 and 308 are floating metals. In other words, the dummy metal lines 306 and 308 are electrically isolated from the first electrode 302, the second electrode 304, and the shielding metal lines 310 and 312. The shielding metal lines 310 and 312 are electrically connected to a reference voltage, e.g. a ground voltage. In an application, the first electrode 302 is connected to the signal node and the second electrode 304 is connected to the common node.

According to some embodiments, the first electrode 302 is configured to be a metal line on a metal layer, e.g. the fourth metal layer M4, above a semiconductor substrate. The second electrode 304 comprising three metal lines 3042, 3044, and 3046, and are configured to be a U-shaped device surrounding the first electrode 302 and the dummy metal lines 306 and 308. The second electrode 304, i.e. the metal lines 3042, 3044, and 3046, is formed on the same metal layer with the first electrode 102, e.g. the fourth metal layer M4. The dummy metal lines 306 and 308 are formed on the same metal layer with the first electrode 102, e.g. the fourth metal layer M4. The first electrode 302, the metal lines 3042 and 3046, and the dummy metal lines 306 and 308 are parallel to each other on the fourth metal layer M4. According to some embodiments, the first electrode 302 is physically separated from the second electrode 304, the dummy metal lines 306 and 308, and the shielding metal lines 310 and 312 by oxide layer (not shown in FIG. 1A) formed among them.

The shielding metal lines 310 and 312 are formed on the metal layer different from the fourth metal layer M4. For example, the shielding metal lines 310 and 312 may be formed on the third metal layer M3, which is below the fourth metal layer M4. However, this is not a limitation of the present embodiment. In another embodiment, the shielding metal lines 310 and 312 may be formed on the fifth metal layer M5, which is above the fourth metal layer M4. Moreover, the shielding metal lines 310 and 312 are two parallel metal lines overlapping with the dummy metal lines 306 and 308 viewed from the top of the capacitive device 300.

According to the embodiments, when the shielding metal lines 310 and 312 are connected to the ground voltage, the electric field (i.e. 314 and 316) of the capacitive device 300 may be confined by the shielding metal lines 310 and 312 such that the electromagnetic (EM) may not radiate to or extend the area outside the shielding metal lines 310 and 312. Therefore, the fringing effect of the capacitive device 300 is improved.

Moreover, when the electric field (i.e. 314 and 316) of the capacitive device 300 is confined by the shielding metal lines 310 and 312, the capacitance of the capacitive device 300 may be fine-tuned to the expected value. For example, in a version of capacitor when the dummy metal lines 306 and 308 and the shielding metal lines 310 and 312 are omitted, the capacitance is C1. In this embodiment, i.e. the capacitive device 300, the capacitance is C2. Then, the capacitance C2 may be accurately tuned into a half of the capacitance C1. In other words, by using the present the dummy metal lines 306 and 308 and the shielding metal lines 310 and 312, the reduction ratio of the capacitance C2 of the capacitive device 300 may be precisely controlled.

Figure 4:
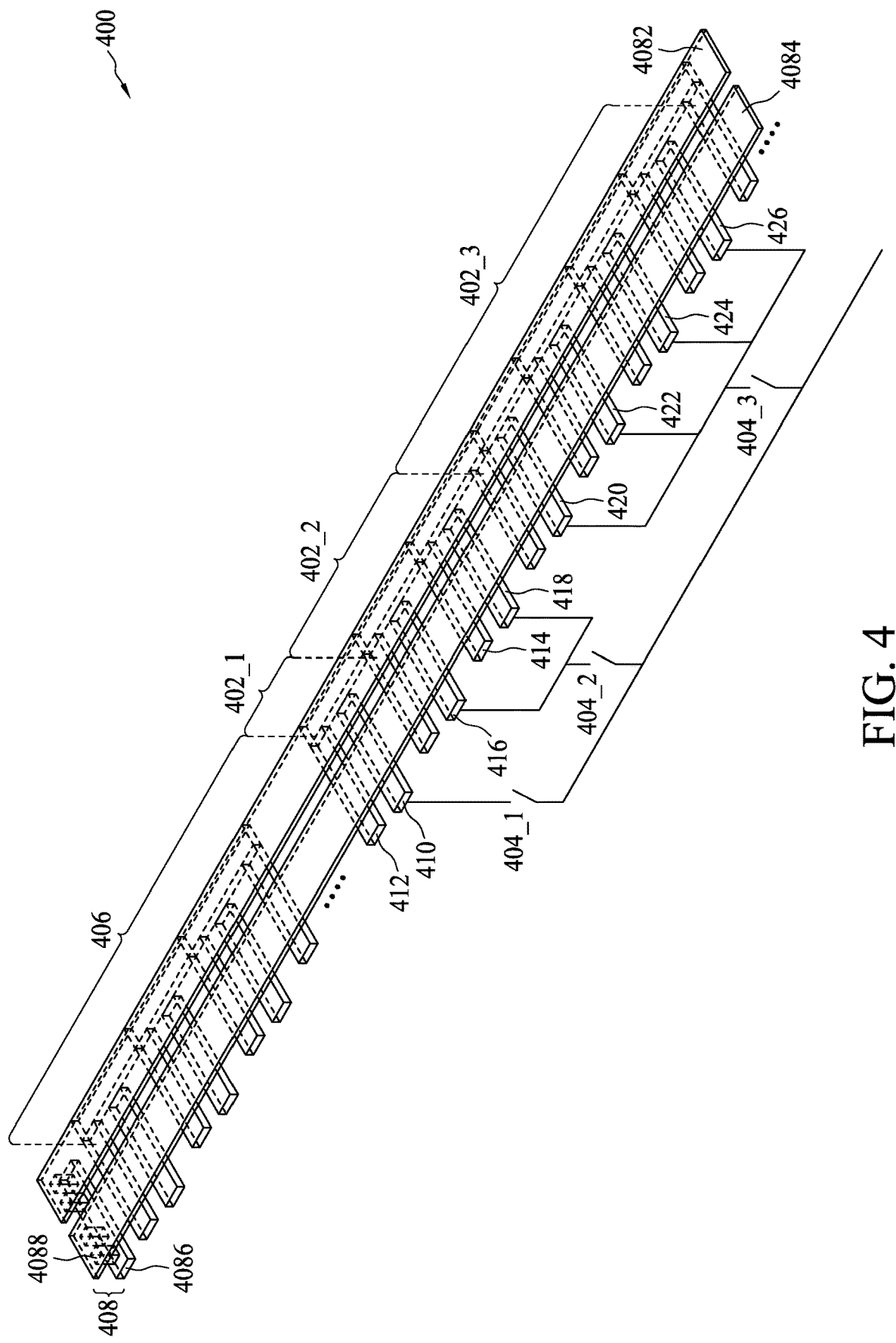
FIG. 4 is a diagram illustrating a capacitor array in accordance with some embodiments.

FIG. 4 is a diagram illustrating a capacitor array 400 in accordance with some embodiments. The capacitor array 400 may be a MOM array. Specifically, the capacitor array 400 may be an array of individually switched binary-weighted MOM capacitors that are applied in a high resolution (e.g. 10 bits) SAR-ADC. The capacitive array 400 comprises a plurality of MOM capacitors 402_1-402_a, a plurality of switches 404_1-404_b, a dummy MOM capacitor 406, and a shielding structure 408.

According to some embodiments, the capacitor array 400 may be regarded as an array formed by a plurality unit capacitors. The MOM capacitor 402_1 may be regarded as the unit capacitor of the capacitor array 400. The MOM capacitor 402_1 comprises a first electrode 410 and a second electrode 412. The second electrode 412 is configured to be a U-shaped structure with two fingers surrounding the first electrode 410. The first electrode 410 and the second electrode 412 are formed on the same metal layer, e.g. the fourth metal layer M4, on a semiconductor substrate.

In FIG. 4, the MOM capacitor 402_2 comprises two unit capacitors. The MOM capacitor 402_3 comprises four unit capacitors, and so on. It is noted that, according to the embodiment, two adjacent unit capacitors share a common finger. For example, the finger 414 is the common finger of the two unit capacitors of the MOM capacitor 402_2.

Moreover, one connecting terminal of the switch 404_1 is connected to the first electrode 410 of the MOM capacitor 402_1. One connecting terminal of the switch 404_2 is connected to the first electrodes 416 and 418 of the MOM capacitor 402_2. One connecting terminal of the switch 404_3 is connected to the first electrodes 420, 422, 424, and 426 of the MOM capacitor 402_3. The connectivity of the rest MOM capacitors and switches are omitted here for brevity. It is noted that the other connecting terminals of the switches 404_1-404_b are connected to each other. Moreover, to improve the matching among the MOM capacitors 402_1-402_a, the routing paths of the MOM capacitors 402_1-402_a are equivalent. For example of the MOM capacitor 402_3, the routing paths from the connecting terminal of the switch 404_3 to the first electrodes 420 and 422 and the routing paths from the connecting terminal of the switch 404_3 to the first electrodes 424 and 426 are symmetrical. In this embodiment, the first electrode of an MOM capacitor may be the signal node, and the second electrode of the MOM capacitor may be the common node.

According to some embodiments, the dummy MOM capacitor 406 is a duplicated structure of the MOM capacitors 402_1-402_a. Therefore, the dummy MOM capacitor 406 may be identical to the MOM capacitors 402_1-402_a. However, the dummy MOM capacitor 406 remains floating or is not connected to any switch.

According to some embodiments, the shielding structure 408 comprises a first metal plate 4082, a second metal plate 4084, a third metal plate 4086, and a plurality of vias 4088. The first metal plate 4082 and the second metal plate 4084 are disposed above the MOM capacitors 402_1-402_a and the dummy MOM capacitor 406. The first metal plate 4082 and the second metal plate 4084 are configured to extend from one side (e.g. the left side) to the other side (e.g. the right side, not shown in FIG. 4) of the capacitive array 400. The vias 4088 are arranged to connect the third metal plate 4086 to the edges of the first metal plate 4082 and the second metal plate 4084. It is noted that the right side of the capacitive array 400 may have structure similar to the left side.

According to some embodiments, the MOM capacitors 402_1-402_a, the third metal plate 4086, and the dummy MOM capacitor 406 are formed in the fourth metal layer M4 (for example). The first metal plate 4082 and the second metal plate 4084 are formed in the fifth metal layer M5 (for example). In other words, the shielding structure 408 is arranged to cover the MOM capacitors 402_1-402_a and the dummy MOM capacitor 406 from the upper side. Accordingly, the electric field of the MOM capacitors 402_1-402_a may be confined by the shielding structure 408. Therefore, the mismatch problem among the MOM capacitors 402_1-402_a is improved. In other words, the capacitor array 400 have relatively small mean shift among the MOM capacitors 402_-402_a.

Figure 5:
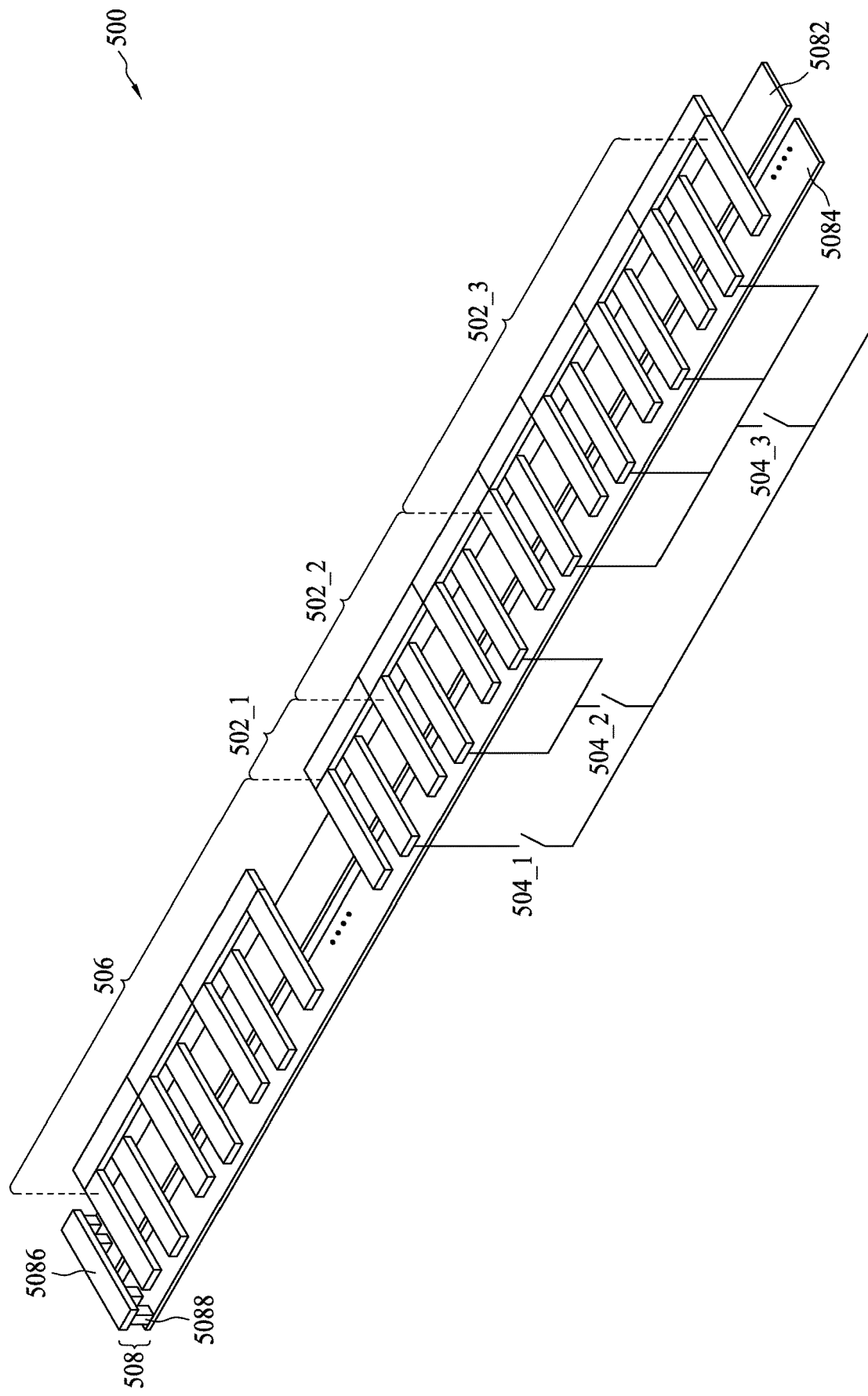
FIG. 5 is a diagram illustrating another capacitor array in accordance with some embodiments.

FIG. 5 is a diagram illustrating a capacitor array 500 in accordance with some embodiments. The capacitor array 500 may be an individually switched binary-weighted MOM capacitors. The capacitive array 500 comprises a plurality of MOM capacitors 502_1-502_a, a plurality of switches 504_1-504_b, a dummy MOM capacitor 506, and a shielding structure 508.

According to some embodiments, the MOM capacitors 502_1-502_a may be regarded as an array formed by a plurality of unit capacitors. For example, the MOM capacitor 502_1 may be regarded as the unit capacitor of the MOM capacitors 502_1-502_a. The dummy MOM capacitor 506 is a duplicated structure of the MOM capacitors 502_1-502_a. It is noted that the structure and the connectivity of the MOM capacitors 502_1-502_a, the switches 504_1-504_b, and the dummy MOM capacitor 506 are similar to the structure and the connectivity of the MOM capacitors 402_1-402_a, the switches 404_1-404_b, and the dummy MOM capacitor 406 respectively, thus the detailed description is omitted here for brevity.

According to some embodiments, the shielding structure 508 comprises a first metal plate 5082, a second metal plate 5084, a third metal plate 5086, and a plurality of vias 5088. The first metal plate 5082 and the second metal plate 5084 are disposed below the MOM capacitors 502_1-502_a and the dummy MOM capacitor 506. The first metal plate 5082 and the second metal plate 5084 are configured to extend from one side (e.g. the left side) to the other side (e.g. the right side, not shown in FIG. 5) of the capacitive array 500. The vias 5088 are arranged to connect the third metal plate 5086 to the edges of the first metal plate 5082 and the second metal plate 5084. It is noted that the right side of the capacitive array 500 may have structure similar to the left side.

According to some embodiments, the MOM capacitors 502_1-502_a, the third metal plate 5086, and the dummy MOM capacitor 506 are formed in the fifth metal layer M5 (for example). The first metal plate 5082 and the second metal plate 5084 are formed in the fourth metal layer M4

(for example). In other words, the shielding structure 508 is arranged to cover the MOM capacitors 502_1-502_a and the dummy MOM capacitor 506 from the lower side. Accordingly, the electric field of the MOM capacitors 502_1-502_a may be confined by the shielding structure 508. Therefore, the mismatch problem among the MOM capacitors 502_1-502_a is improved.

Figure 6:
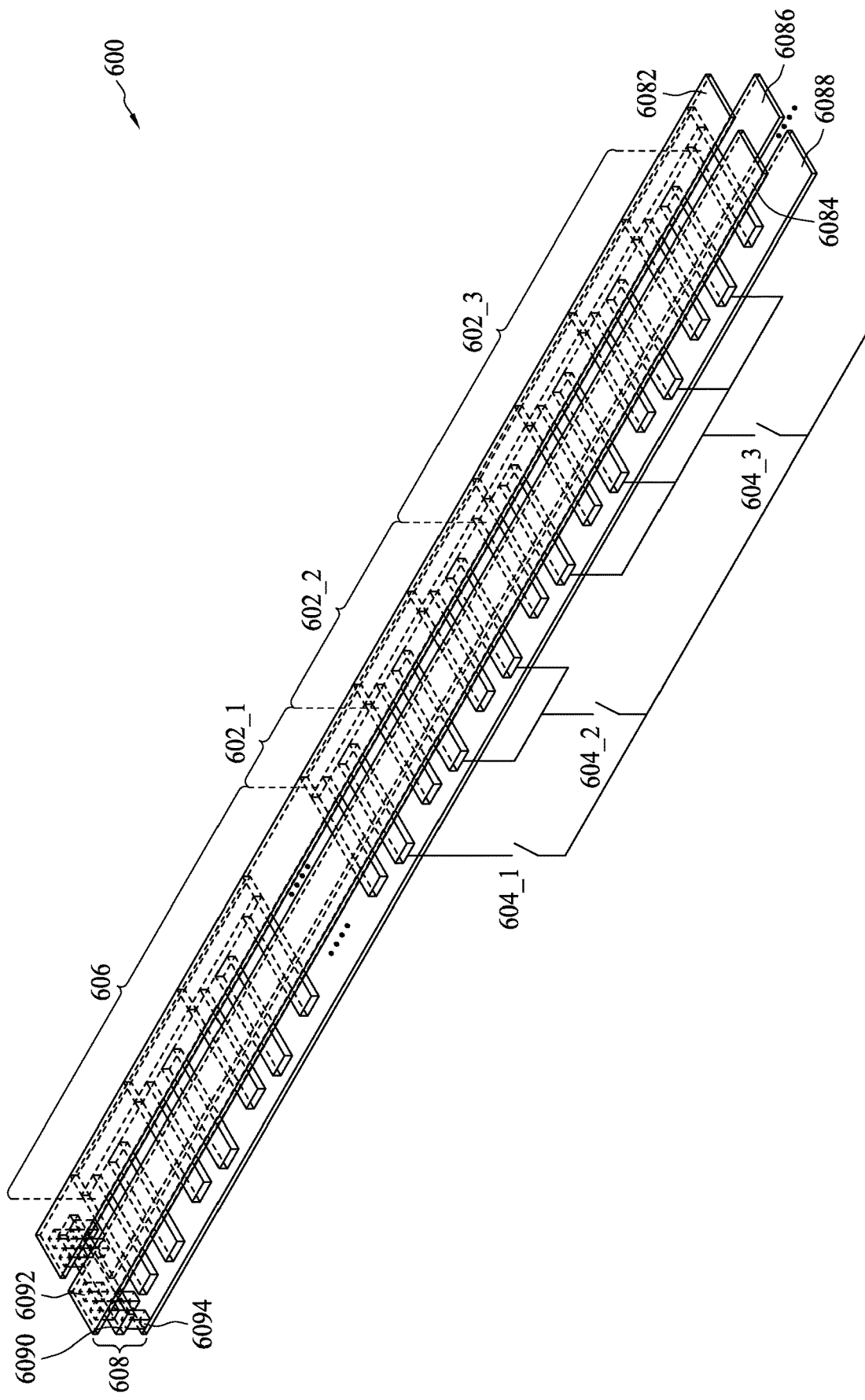
FIG. 6 is a diagram illustrating another capacitor array in accordance with some embodiments.

FIG. 6 is a diagram illustrating a capacitor array 600 in accordance with some embodiments. The capacitor array 600 may be an individually switched binary-weighted MOM capacitors. The capacitive array 600 comprises a plurality of MOM capacitors 602_1-602_a, a plurality of switches 604_1-604_b, a dummy MOM capacitor 606, and a shielding structure 608.

According to some embodiments, the MOM capacitors 602_1-602_a may be regarded as an array formed by a plurality of unit capacitors. For example, the MOM capacitor 602_1 may be regarded as the unit capacitor of the MOM capacitors 602_1-602_a. The dummy MOM capacitor 606 is a duplicated structure of the MOM capacitors 602_1-602_a. It is noted that the structure and the connectivity of the MOM capacitors 602_1-602_a, the switches 604_1-604_b, and the dummy MOM capacitor 606 are similar to the structure and the connectivity of the MOM capacitors 402_1-402_a, the switches 404_1-404_b, and the dummy MOM capacitor 406 respectively, thus the detailed description is omitted here for brevity.

According to some embodiments, the shielding structure 608 comprises a first metal plate 6082, a second metal plate 6084, a third metal plate 6086, a fourth metal plate 6088, a fifth metal plate 6090, a plurality of first vias 6092, and a plurality of second vias 6094. The first metal plate 6082 and the second metal plate 6084 are disposed above the MOM capacitors 602_1-602_a and the dummy MOM capacitor 606. The third metal plate 6086 and the fourth metal plate 6088 are disposed below the MOM capacitors 602_1-602_a and the dummy MOM capacitor 606. The metal plates 6082, 6084, 6086, and 6088 are configured to extend from one side (e.g. the left side) to the other side (e.g. the right side, not shown in FIG. 6) of the capacitive array 600. The first vias 6092 are arranged to connect the upper surface of the fifth metal plate 6090 to lower surfaces on the edges of the metal plates 6082 and 6084. The second vias 6094 are arranged to connect the lower surface of the fifth metal plate 6090 to upper surfaces on the edges of the metal plates 6086 and 6088. It is noted that the right side of the capacitive array 600 may have structure similar to the left side.

According to some embodiments, the MOM capacitors 602_1-602_a, the fifth metal plate 6090, and the dummy MOM capacitor 606 are formed in the fifth metal layer M5 (for example). The metal plates 6082 and 6084 are formed in the sixth metal layer M6 (for example). The metal plates 6086 and 6088 are formed in the fourth metal layer M4 (for example). In other words, the shielding structure 608 is arranged to surround the MOM capacitors 602_1-602_a and the dummy MOM capacitor 606. Accordingly, the electric field of the MOM capacitors 602_1-602_a may be confined by the shielding structure 608. Therefore, the mismatch problem among the MOM capacitors 602_1-602_a is improved.

Figure 7:
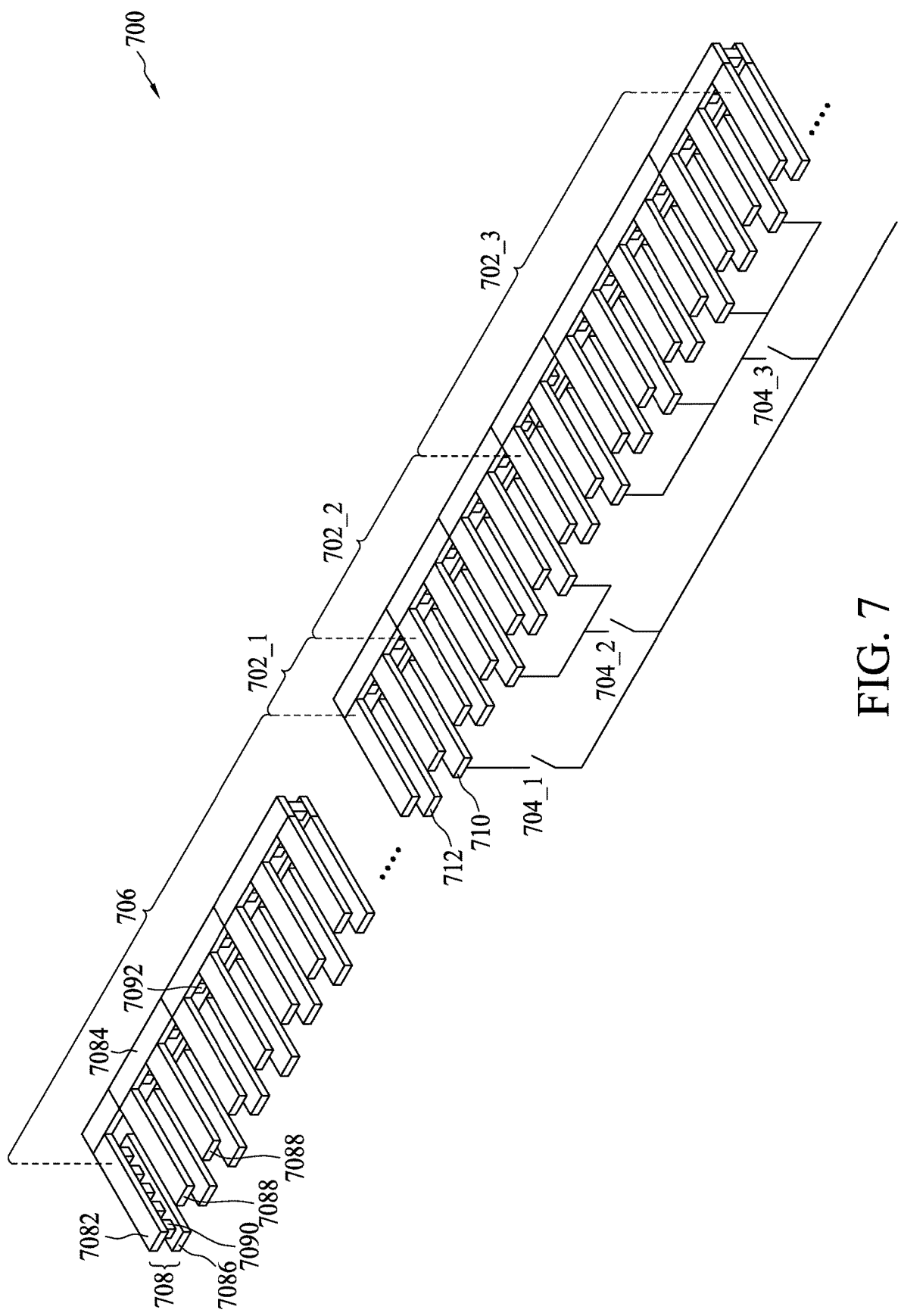
FIG. 7 is a diagram illustrating another capacitor array in accordance with some embodiments.

FIG. 7 is a diagram illustrating a capacitor array 700 in accordance with some embodiments. The capacitor array 700 may be an individually switched binary-weighted MOM capacitors. The capacitive array 700 comprises a plurality of MOM capacitors 702_1-702_a, a plurality of switches 704_1-704_b, a dummy MOM capacitor 706, and a shielding structure 708.

According to some embodiments, the MOM capacitors 702_1-702_a may be regarded as an array formed by a plurality of unit capacitors. For example, the MOM capacitor 702_1 may be regarded as the unit capacitor of the MOM capacitors 702_1-702_a. The dummy MOM capacitor 706 is a duplicated structure of the MOM capacitors 702_1-702_a. It is noted that the structure and the connectivity of the MOM capacitors 702_1-702_a, the switches 704_1-704_b, and the dummy MOM capacitor 706 are similar to the structure and the connectivity of the MOM capacitors 402_1-402_a, the switches 404_1-404_b, and the dummy MOM capacitor 406 respectively, thus the detailed description is omitted here for brevity.

According to some embodiments, the shielding structure 708 comprises a first metal plate 7082, a second metal plate 7084, a third metal plate 7086, a plurality of fingers 7088, a plurality of first vias 7090, and a plurality of second vias 7092. The fingers 7088 are disposed above the fingers (e.g. the first electrode 710 and the second electrode 712) of the MOM capacitors 702_1-702_a and the dummy MOM capacitor 706. Moreover, the fingers 7088 are overlapped with the fingers of the MOM capacitors 702_1-702_a and the dummy MOM capacitor 706 viewed from the top of the capacitor array 700. The first metal plate 7082 is disposed adjacent and parallel to the left most finger 7088 of the shielding structure 708. The third metal plate 7086 is disposed adjacent and parallel to the left most finger of the dummy MOM capacitors 706. The second metal plate 7084 is connected to the back ends of the third metal plate 7082 and the fingers 7088. The first vias 7090 are arranged to couple the first metal plate 7082 to the third metal plate 7086. The second vias 7092 are arranged to couple the second metal plate 7084 to the second electrodes (e.g. 712) of the MOM capacitors 702_1-702_a and the dummy second electrodes of the dummy MOM capacitor 706. It is noted that the right side of the capacitive array 700 may have structure similar to the left side.

According to some embodiments, the MOM capacitors 702_1-702_a, the third metal plate 7086, and the dummy MOM capacitor 706 are formed in the fourth metal layer M4 (for example). The first metal plate 7082, the second metal plate 7084, and the fingers 7088 are formed in the fifth metal layer M5 (for example). In other words, the shielding structure 708 is arranged to cover the MOM capacitors 702_1-702_a and the dummy MOM capacitor 706 from the upper side. Accordingly, the electric field of the MOM capacitors 702_1-702_a may be confined by the shielding structure 708. Therefore, the mismatch problem among the MOM capacitors 702_1-702_a is improved.

Figure 8:
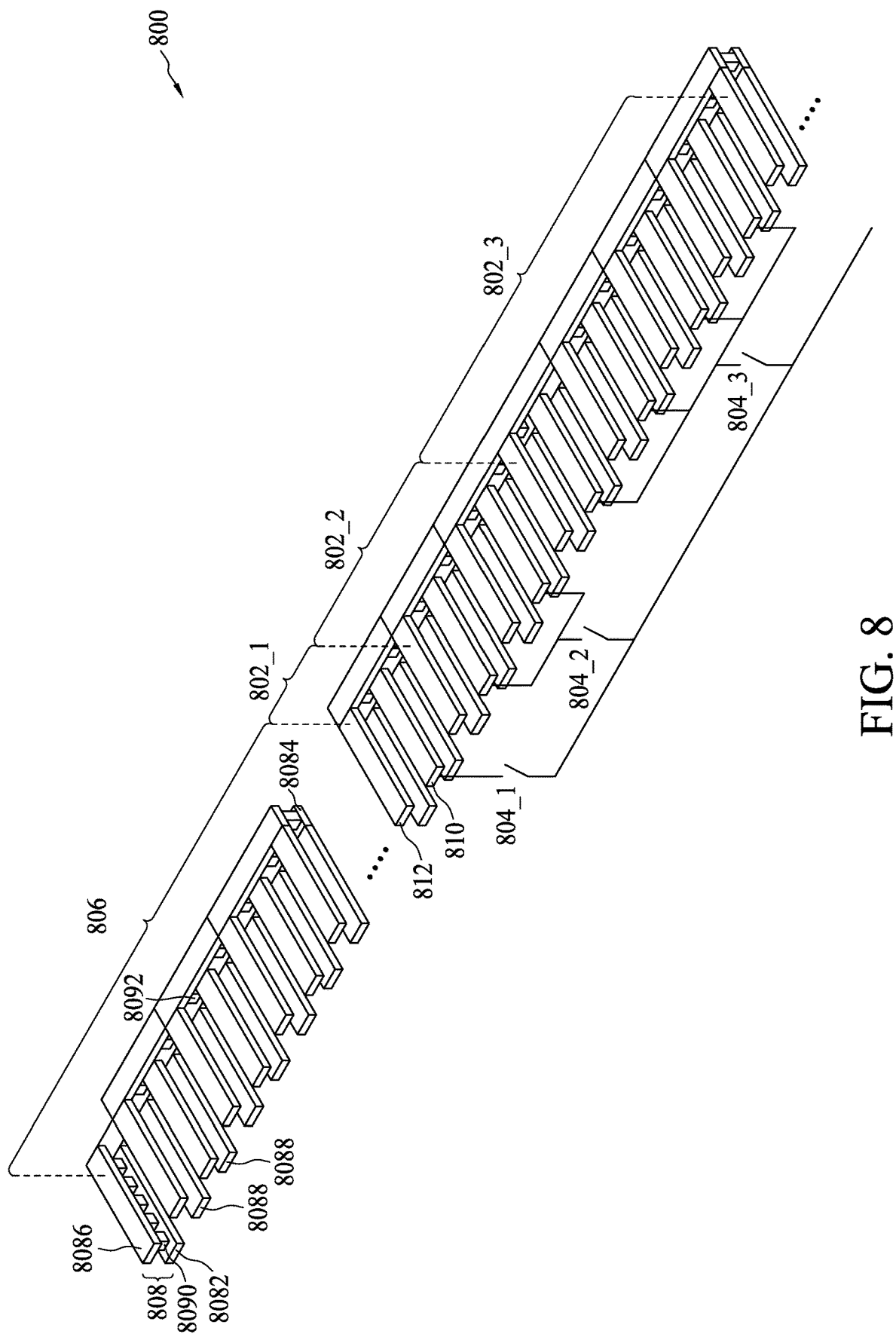
FIG. 8 is a diagram illustrating another capacitor array in accordance with some embodiments.

FIG. 8 is a diagram illustrating a capacitor array 800 in accordance with some embodiments. The capacitor array 800 may be an individually switched binary-weighted MOM capacitors. The capacitive array 800 comprises a plurality of MOM capacitors 802_1-802_a, a plurality of switches 804_1-804_b, a dummy MOM capacitor 806, and a shielding structure 808.

According to some embodiments, the MOM capacitors 802_1-802_a may be regarded as an array formed by a plurality unit capacitors. For example, the MOM capacitor 802_1 may be regarded as the unit capacitor of the MOM capacitors 802_1-802_a. The dummy MOM capacitor 806 is a duplicated structure of the MOM capacitors 802_1-802_a. It is noted that the structure and the connectivity of the MOM capacitors 802_1-802_a, the switches 804_1-804_b, and the dummy MOM capacitor 806 are similar to the structure and the connectivity of the MOM capacitors 402_1-402_a, the switches 404_1-404_b, and the dummy MOM capacitor 406 respectively, thus the detailed description is omitted here for brevity.

According to some embodiments, the shielding structure 808 comprises a first metal plate 8082, a second metal plate 8084, a third metal plate 8086, a plurality of fingers 8088, a plurality of first vias 8090, and a plurality of second vias 8092. The fingers 8088 are disposed below the fingers (e.g. the first electrode 810 and the second electrode 812) of the MOM capacitors 802_1-802_*a* and the dummy MOM capacitor 806. Moreover, the fingers 8088 are overlapped with the fingers of the MOM capacitors 802_1-802_*a* and the dummy MOM capacitor 806 viewed from the top of the capacitor array 800. The first metal plate 8082 is disposed adjacent and parallel to the left most finger of the shielding structure 808. The third metal plate 8086 is disposed adjacent and parallel to the left most finger of the dummy MOM capacitors 806. The second metal plate 8084 is connected to the back ends of the third metal plate 8082 and the fingers 8088. The first vias 8090 are arranged to couple the first metal plate 8082 to the third metal plate 8086. The second vias 8092 are arranged to couple the second metal plate 8084 to the second electrodes (e.g. 812) of the MOM capacitors 802_1-702_*a* and the dummy second electrodes of the dummy MOM capacitor 806. It is noted that the right side of the capacitive array 800 may have structure similar to the left side.

According to some embodiments, the MOM capacitors 802_1-802_*a*, the third metal plate 8086, and the dummy MOM capacitor 806 are formed in the fifth metal layer M5 (for example). The first metal plate 8082, the second metal plate 8084, and the fingers 8088 are formed in the fourth metal layer M4 (for example). In other words, the shielding structure 808 is arranged to cover the MOM capacitors 802_1-802_*a* and the dummy MOM capacitor 806 from the lower side. Accordingly, the electric field of the MOM capacitors 802_1-802_*a* may be confined by the shielding structure 808. Therefore, the mismatch problem among the MOM capacitors 802_1-802_*a* is improved.

Figure 9:
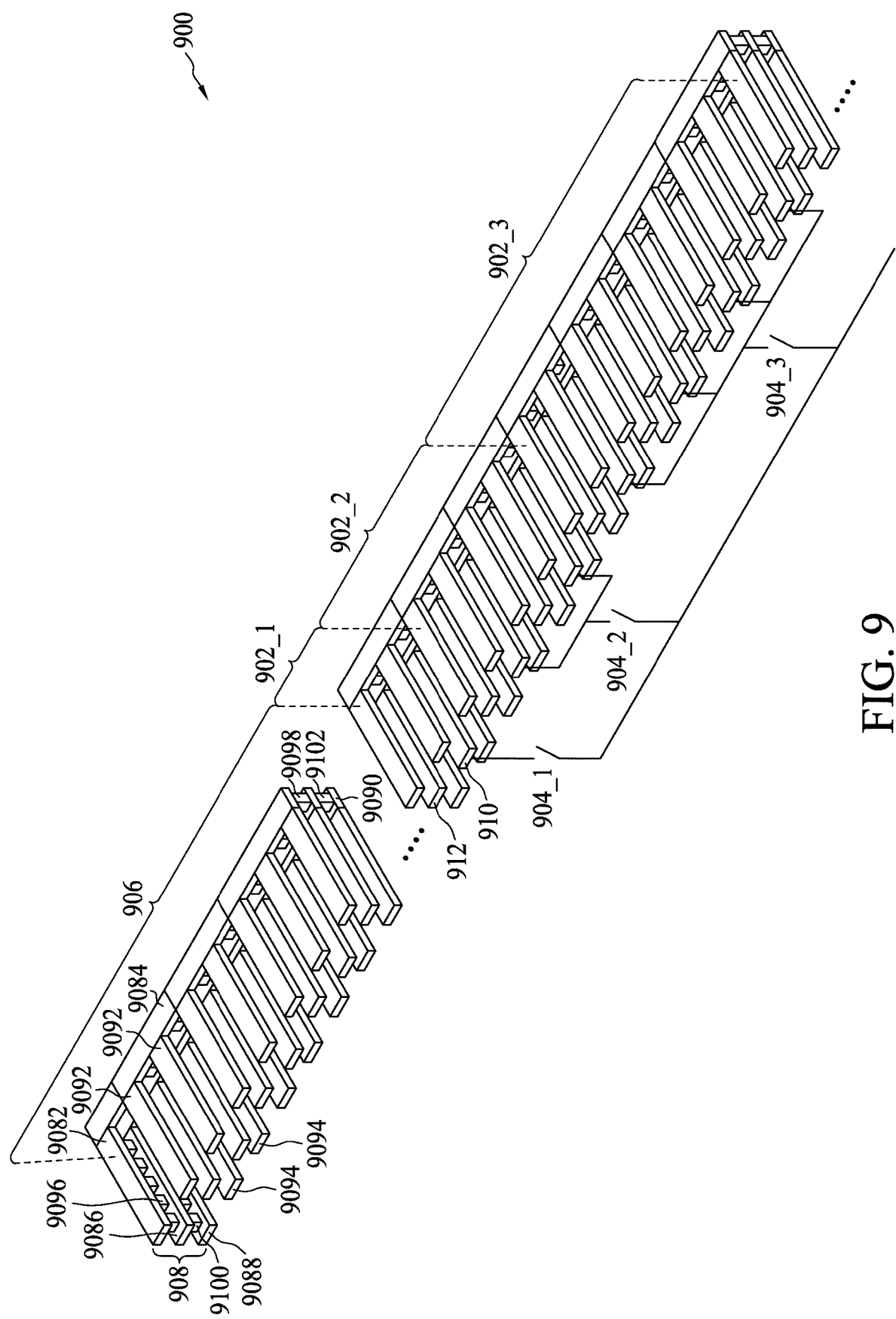
FIG. 9 is a diagram illustrating another capacitor array in accordance with some embodiments.

FIG. 9 is a diagram illustrating a capacitor array 900 in accordance with some embodiments. The capacitor array 900 may be an individually switched binary-weighted MOM capacitors. The capacitive array 900 comprises a plurality of MOM capacitors 902_1-902_*a*, a plurality of switches 904_1-904_*b*, a dummy MOM capacitor 906, and a shielding structure 908.

According to some embodiments, the MOM capacitors 902_1-902_*a* may be regarded as an array formed by a plurality unit capacitors. For example, the MOM capacitor 902_1 may be regarded as the unit capacitor of the MOM capacitors 902_1-902_*a*. The dummy MOM capacitor 906 is a duplicated structure of the MOM capacitors 902_1-902_*a*. It is noted that the structure and the connectivity of the MOM capacitors 902_1-902_*a*, the switches 904_1-904_*b*, and the dummy MOM capacitor 906 are similar to the structure and the connectivity of the MOM capacitors 402_1-402_*a*, the switches 404_1-404_*b*, and the dummy MOM capacitor 406 respectively, thus the detailed description is omitted here for brevity.

According to some embodiments, the shielding structure 908 comprises a first metal plate 9082, a second metal plate 9084, a third metal plate 9086, a fourth metal plate 9088, a fifth metal plate 9090, a plurality of first fingers 9092, a plurality of second fingers 9094, a plurality of first vias 9096, a plurality of second vias 9098, a plurality of third vias 9100, and a plurality of fourth vias 9102.

The fingers 9092 are disposed above the fingers (e.g. the first electrode 910 and the second electrode 912) of the MOM capacitors 902_1-902_*a* and the dummy MOM capacitor 906. The fingers 9094 are disposed below the fingers (e.g. the first electrode 910 and the second electrode 912) of the MOM capacitors 902_1-902_*a* and the dummy MOM capacitor 906. Moreover, the fingers 9092 and 9094 are overlapped with the fingers of the MOM capacitors 902_1-902_*a* and the dummy MOM capacitor 906 viewed from the top of the capacitor array 900. The metal plate 9082 is disposed adjacent and parallel to the left most finger 9092 of the shielding structure 906. The metal plate 9088 is disposed adjacent and parallel to the left most finger 9094 of the shielding structure 906. The metal plate 9086 is disposed adjacent and parallel to the left most finger of the MOM capacitors 902_1-902_*a*. The metal plate 9084 is connected to the back ends of the metal plate 9082 and the fingers 9092. The metal plate 9102 is connected to the back ends of the metal plate 9088 and the fingers 9094.

The vias 9096 are arranged to couple the upper surface of the metal plate 9086 to the lower surface of the metal plate 9082. The vias 9098 are arranged to couple the upper surface of the second electrodes (e.g. 912) of the MOM capacitors 902_1-902_*a* and the dummy second electrodes of the dummy MOM capacitor 906 to the lower surface of the metal plate 9098.

The vias 9100 are arranged to couple the lower surface of the metal plate 9086 to the upper surface of the metal plate 9088. The vias 9102 are arranged to couple the lower surface of the second electrodes (e.g. 912) of the MOM capacitors 902_1-902_*a* and the dummy second electrodes of the dummy MOM capacitor 906 to the upper surface of the metal plate 9090.

It is noted that the right side of the capacitive array 900 may have structure similar to the left side.

According to some embodiments, the MOM capacitors 902_1-902_*a*, the metal plate 9086, and the dummy MOM capacitor 906 are formed in the fifth metal layer M5 (for example). The metal plates 9082, 9084, and the finger 9092 are formed in the sixth metal layer M6 (for example). The metal plates 9088, 9090, and the fingers 9094 are formed in the fourth metal layer M4 (for example). In other words, the shielding structure 908 is arranged to surround the MOM capacitors 902_1-902_*a* and the dummy MOM capacitor 906. Accordingly, the electric field of the MOM capacitors 902_1-902_*a* may be confined by the shielding structure 908. Therefore, the mismatch problem among the MOM capacitors 902_1-902_*a* is improved.

Figure 10:
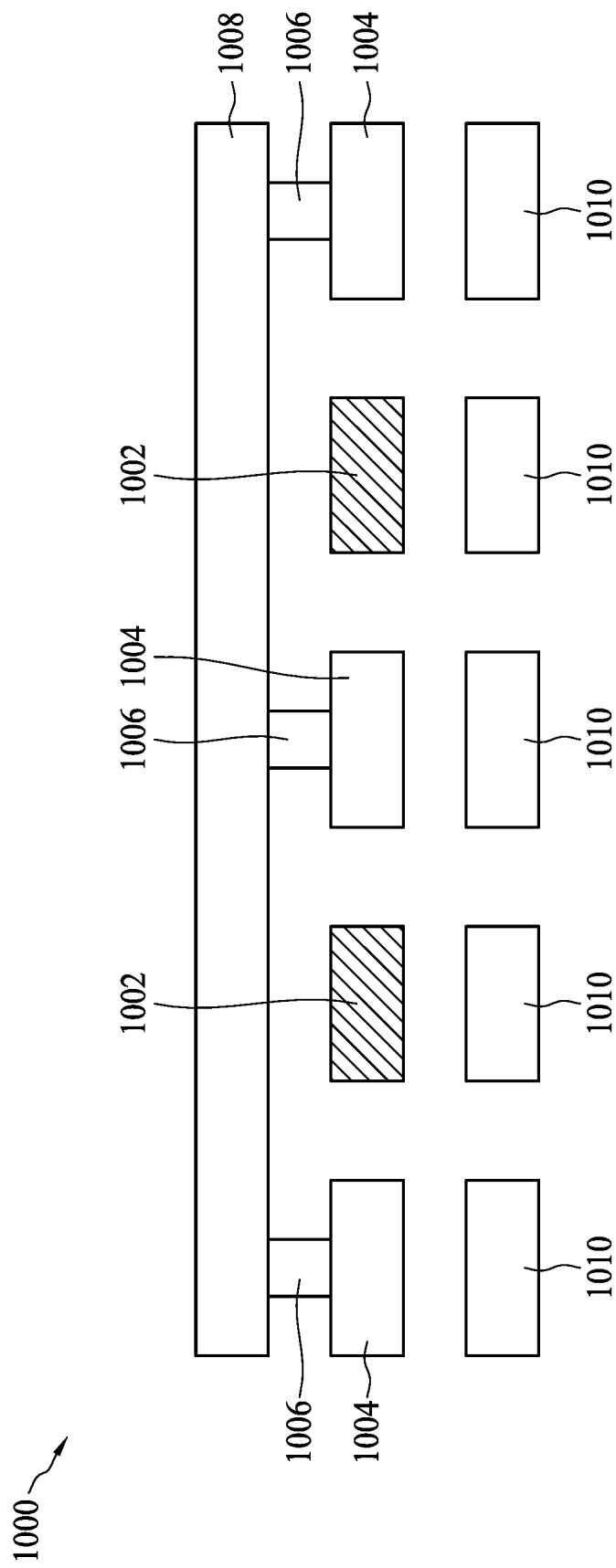
FIG. 10 is a diagram illustrating a cross-sectional view of a portion of a capacitor array in accordance with some embodiments.

FIG. 10 is a diagram illustrating a cross-sectional view of a portion 1000 of a capacitor array in accordance with some embodiments. The capacitor array may be an enhanced version of the capacitor array 700. However, this is not a limitation of the present embodiment. The ideal may be applied in all the other embodiments, e.g. the capacitor arrays 400, 500, 600, 800, or 900. The portion 1000 comprises a plurality of first-electrode fingers 1002, a plurality second-electrode fingers 1004, a plurality of vias 1006, a metal plate 1008, and a plurality of dummy metal plates 1010. The vias 1006 are arranged to couple the second-electrode fingers 1004 to the metal plate 1008. The structure of the first-electrode fingers 1002, the second-electrode fingers 1004, the vias 1006, and the metal plate 1008 are similar to the MOM capacitors of the capacitor array 700, thus the detailed description is omitted here for brevity.

In this embodiment, the dummy metal plates 1010 are disposed below the first-electrode fingers 1002 and the second-electrode fingers 1004. The dummy metal plates 1010 may have uniform and regular dummy pattern. Specifically, the metal width of each dummy metal plate 1010 is similar to the width of the corresponding finger such that the first-electrode fingers 1002 and the second-electrode fingers 1004 are overlapped with the dummy metal plates 1010 viewed from the top of the capacitor array.

According to some embodiments, the first-electrode fingers 1002 and the second-electrode fingers 1004 may be formed in the fifth metal layer M5 (for example). The metal plate 1008 may be formed in the sixth metal layer M6 (for example). The dummy metal plates 1010 may be formed in the fourth metal layer M4 (for example).

When the dummy pattern of the dummy metal plates 1010 is similar to the pattern of the first-electrode fingers 1002 and the second-electrode fingers 1004 of a MOM capacitor, the coupling error of the MOM capacitor may be reduced. Accordingly, the mismatch problem among the MOM capacitors may be improved.

Briefly, the proposed embodiment provides a binary-weighted MOM capacitors that are applied in a high resolution SAR-ADC. The MOM capacitors has relatively low operation current and low power consumption. The electric and magnetic fields of the MOM capacitors are confined by the present shielding device such that the coupling error is minimized and the mismatch problem among the MOM capacitors is improved.

It is noted that the term "metal" mentioned in the above embodiments is merely an exemplary conductive material, and this is not a limitation of the present embodiments.

In some embodiments, the present disclosure provides an integrated circuit structure. The integrated circuit structure includes a first conductive plate, a second conductive plate, a plurality of conductive lines, and a plurality of conductive vias. The first conductive plate is disposed in a first layer on a semiconductor substrate. The second conductive plate is disposed in a second layer on the semiconductor substrate. The plurality of conductive lines are disposed in the first layer for surrounding the first conductive plate. The plurality of conductive vias are arranged to couple the plurality of conductive lines to the second conductive plate. The second layer is different from the first layer, and the first conductive plate is physically separated from the second conductive plate, the plurality of conductive lines, and the plurality of conductive vias.

In some embodiments, the present disclosure provides an integrated circuit structure. The integrated circuit structure includes a plurality of capacitors, a first conductive plate, a second conductive plate, and a plurality of first conductive vias. The plurality of capacitors are disposed in a first layer on a semiconductor substrate. The first conductive plate are disposed in the first layer on a first side of the plurality of capacitors. The second conductive plate is disposed in a second layer on the semiconductor substrate for extending to a second side of the plurality of capacitors from the first side of the plurality of capacitors. The plurality of first conductive vias are arranged to couple the first conductive plate to an edge of the second conductive plate.

In some embodiments, the present disclosure provides a method of manufacturing an integrated circuit structure. The method includes forming a plurality of capacitors in a first layer on a semiconductor substrate; forming a first conductive plate in the first layer on a first side of the plurality of capacitors; forming a second conductive plate in a second layer on the semiconductor substrate, for extending to a second side of the plurality of capacitors from the first side of the plurality of capacitors; and forming a plurality of first conductive vias coupled the first conductive plate to an edge of the second conductive plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure, comprising:
   a plurality of capacitors, disposed in a first layer on a semiconductor substrate;
   a dummy capacitor structure, adjacent to the plurality of capacitors in the first layer, wherein the dummy capacitor and the plurality of capacitor are arranged as a strip-shaped structure;
   a first conductive plate, located at one end of the stripe-shaped structure in the first layer;
   a second conductive plate, disposed in a second layer on the semiconductor substrate over the stripe-shaped structure, for extending toward the other end of the stripe-shaped structure from said one end of the stripe-shaped structure; and
   a plurality of first conductive vias, arranged to couple the first conductive plate to an edge of the second conductive plate.

2. The integrated circuit structure of claim 1, further comprising:
   a third conductive plate, disposed in the second layer and in parallel to the second conductive plate and over the stripe-shaped structure, for extending toward said the other end of the stripe-shaped structure from said one end of the stripe-shaped structure;
   wherein the plurality of first conductive vias are further arranged to couple the first conductive plate to an edge of the third conductive plate.

3. The integrated circuit structure of claim 2, further comprising:
   a fourth conductive plate, disposed in a third layer on the semiconductor substrate and below the stripe-shaped structure, for extending toward said the other end of the stripe-shaped structure from said one end of the stripe-shaped structure, wherein the third layer is different from the first layer and the second layer; and
   a plurality of second conductive vias, arranged to couple the first conductive plate to an edge of the fourth conductive plate.

4. The integrated circuit structure of claim 3, further comprising:
   a fifth conductive plate, disposed in the third layer and in parallel to the fourth conductive plate, for extending to said the other end of the stripe-shaped structure from said one end of the stripe-shaped structure;
   wherein the plurality of second conductive vias are further arranged to couple the first conductive plate to an edge of the fifth conductive plate.

5. The integrated circuit structure of claim 1, further comprising:
   a third conductive plate, disposed in the second layer and in parallel to the first conductive plate, for connecting to the edge of the second conductive plate;

wherein the plurality of first conductive vias are arranged to connect the first conductive plate to the third conductive plate.

6. An integrated circuit structure, comprising:
a plurality of capacitors, disposed in a first layer on a semiconductor substrate;
a dummy structure, adjacent to the plurality of capacitors in the first layer,;
a first conductive plate, disposed in the first layer at one end of the dummy structure;
a second conductive plate, disposed in a second layer on the semiconductor substrate, for extending to the other end of the dummy structure from said one end of the dummy structure; and
a plurality of first conductive vias, arranged to couple the first conductive plate to an edge of the second conductive plate.

7. The integrated circuit structure of claim 6, further comprising:
a third conductive plate, disposed in the second layer and in parallel to the second conductive plate, for extending to the other end of the dummy structure from said one end of the dummy structure;
wherein the plurality of first conductive vias are further arranged to couple the first conductive plate to an edge of the third conductive plate.

8. The integrated circuit structure of claim 7, further comprising:
a fourth conductive plate, disposed in a third layer on the semiconductor substrate, for extending to the other end of the dummy structure from said one end of the dummy structure, wherein the third layer is different from the first layer and the second layer; and
a plurality of second conductive vias, arranged to couple the first conductive plate to an edge of the fourth conductive plate.

9. The integrated circuit structure of claim 8, further comprising:
a fifth conductive plate, disposed in the third layer and in parallel to the fourth conductive plate, for extending to the other end of the dummy structure from said one end of the dummy structure;
wherein the plurality of second conductive vias are further arranged to couple the first conductive plate to an edge of the fifth conductive plate.

10. The integrated circuit structure of claim 6, further comprising:
a third conductive plate, disposed in the second layer and in parallel to the first conductive plate, for connecting to the edge of the second conductive plate;
wherein the plurality of first conductive vias are arranged to connect the first conductive plate to the third conductive plate.

11. The integrated circuit structure of claim 10, wherein the plurality of capacitors comprises a plurality of first-electrode fingers and a plurality of second-electrode fingers, and the integrated circuit structure further comprises:
a plurality of second conductive fingers disposed in the second layer and coupled to the second conductive plate;
wherein the plurality of second conductive fingers are substantially overlapped with the plurality of first-electrode fingers and the plurality of second-electrode fingers viewed from a top of the integrated circuit structure respectively.

12. The integrated circuit structure of claim 11, further comprising a plurality of second conductive vias, arranged to couple the second conductive plate to the plurality of second-electrode fingers.

13. The integrated circuit structure of claim 12, further comprising:
a plurality of dummy conductive plates, disposed in a third layer on the semiconductor substrate;
wherein the third layer is different from the first layer and the second layer, and the plurality of dummy conductive plates are substantially overlapped with the plurality of first-electrode fingers and the plurality of second-electrode fingers viewed from the top of the integrated circuit structure respectively.

14. The integrated circuit structure of claim 12, further comprising:
a fourth conductive plate, disposed in a third layer on the semiconductor substrate, for extending to the other end of the dummy structure from said one end of the dummy structure, wherein the third layer is different from the first layer and the second layer; and
a plurality of second conductive vias, arranged to couple the first conductive plate to an edge of the fourth conductive plate.

15. The integrated circuit structure of claim 14, further comprising:
a fifth conductive plate, disposed in the third layer and in parallel to the first conductive plate, for connecting to the edge of the fourth conductive plate;
wherein the plurality of second conductive vias are arranged to connect the first conductive plate to the fifth conductive plate.

16. The integrated circuit structure of claim 15, further comprising:
a plurality of third conductive fingers disposed in the third layer and coupled to the fourth conductive plate;
wherein the plurality of third conductive fingers are substantially overlapped with the plurality of first-electrode fingers and the plurality of second-electrode fingers viewed from the top of the integrated circuit structure respectively.

17. The integrated circuit structure of claim 16, further comprising
a plurality of third conductive vias, arranged to couple the fourth conductive plate to the plurality of second-electrode fingers.

18. A method of manufacturing an integrated circuit structure, comprising:
forming a plurality of capacitors in a first layer on a semiconductor substrate;
forming a dummy structure, adjacent to the plurality of capacitors in the first layer;
forming a first conductive plate in the first layer at one end of the dummy structure;
forming a second conductive plate in a second layer on the semiconductor substrate, for extending to the other end of the dummy structure from said one end of the dummy structure; and
forming a plurality of first conductive vias coupled the first conductive plate to an edge of the second conductive plate.

19. The method of claim 18, further comprising:
forming a third conductive plate extending to the other end of the dummy structure from said one end of the dummy structure in the second layer and in parallel to the second conductive plate; and forming a plurality of second conductive vias coupled the first conductive plate to an edge of the third conductive plate.

20. The method of claim 18, further comprising:

forming a third conductive plate connecting to the edge of the second conductive plate in the second layer and in parallel to the first conductive plate;

wherein forming the plurality of first conductive vias coupled the first conductive plate to the edge of the second conductive plate comprises:

forming the plurality of first conductive vias connecting the first conductive plate to the third conductive plate.

* * * * *